United States Patent
Chidambaram et al.

(10) Patent No.: US 6,682,980 B2
(45) Date of Patent: Jan. 27, 2004

(54) FABRICATION OF ABRUPT ULTRA-SHALLOW JUNCTIONS USING ANGLED PAI AND FLUORINE IMPLANT

(75) Inventors: P. R. Chidambaram, Richardson, TX (US); Amitava Chatterjee, Plano, TX (US); Srinivasan Chakravarthi, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/139,672

(22) Filed: May 6, 2002

(65) Prior Publication Data

US 2003/0207542 A1 Nov. 6, 2003

(51) Int. Cl.$^7$ .............................................. H01L 21/336
(52) U.S. Cl. ......................... 438/302; 438/301; 438/286
(58) Field of Search ................................. 438/302, 286, 438/287, 288, 289, 290, 291, 528, 301

(56) References Cited

U.S. PATENT DOCUMENTS

| | | | |
|---|---|---|---|
| 6,037,640 A | | 3/2000 | Lee |
| 6,054,386 A | * | 4/2000 | Prabhakar .................. 438/682 |
| 6,096,628 A | * | 8/2000 | Greenlaw et al. ........... 438/530 |
| 6,204,132 B1 | | 3/2001 | Kittl et al. |
| 6,235,599 B1 | | 5/2001 | Yu |
| 6,326,289 B1 | | 12/2001 | Rodder et al. |
| 6,335,253 B1 | * | 1/2002 | Chong et al. ............... 438/528 |
| 6,355,543 B1 | | 3/2002 | Yu |
| 6,359,307 B1 | | 3/2002 | Wang et al. |
| 6,365,446 B1 | * | 4/2002 | Chong et al. ............... 438/301 |
| 6,365,476 B1 | * | 4/2002 | Talwar et al. ............... 438/301 |
| 6,514,829 B1 | * | 2/2003 | Yu ............................. 438/302 |

OTHER PUBLICATIONS

"Effect of Fluorine on the Diffusion of Boron in Ion Implanted Si", Daniel F. Downey, Judy W. Chow, Emi Ishida and Kevin S. Jones, Applied Physics Letters, 1998 American Institute of Physics, vol. 73, No. 9, Aug. 31, 1998, pp. 1263–1265.

"Modeling Solid Source Boron Diffusion for Advanced Transistor Applications", P. Packan, S. Thompson, E Andideh, S. Yu, T. Ghani, M. Giles, J. Sandford and M. Bohr, 1998 IEEE, IEDM 98, pp. 505–508.

* cited by examiner

Primary Examiner—John F. Niebling
Assistant Examiner—Walter L. Lindsay, Jr.
(74) Attorney, Agent, or Firm—Yingsheng Tung; Wade James Brady, III; Frederick J. Telecky, Jr.

(57) ABSTRACT

The present invention is directed to a method of forming a PMOS transistor within a semiconductor substrate, and comprises forming a gate over an n-type portion of the semiconductor substrate, thereby defining a source region and a drain region in the semiconductor substrate with a channel region therebetween. The source and drain region of the semiconductor substrate are then subjected to an angled amorphization implant, wherein the angled amorphization implant amorphizes the semiconductor substrate thereat and in portions of the channel region near a lateral edge of the gate, thereby defining an amorphized source extension region and drain extension region, respectively. The method continue with an implantation of the source region and the drain region with a lightly doped p-type source/drain implant, followed by an anneal to repair damage in the semiconductor substrate due to the pre-amorphizing implant and the lightly doped source/drain implantation. The amorphized source and drain extension regions advantageously reduce a lateral diffusion thereof during the anneal.

29 Claims, 11 Drawing Sheets

FABRICATION OF ABRUPT ULTRA-SHALLOW JUNCTIONS USING ANGLED PAI AND FLUORINE IMPLANT

FIELD OF THE INVENTION

The present invention relates generally to semiconductor device manufacturing and more particularly to methods of manufacturing devices with ultra-shallow junctions.

BACKGROUND OF THE INVENTION

In the semiconductor industry, there is a continuing trend toward high device densities. To achieve these high device densities, small features on semiconductor wafers are required. These features include source regions, drain regions, and channel regions that relate to devices, such as field effect transistors (FETs).

Because transistor devices make up one of the integral components of today's integrated circuits, a reduction in the size of transistors (often called "scaling") is constantly being pursued. Prior art FIG. 1 is a fragmentary cross section diagram illustrating a conventional MOS type transistor 10. The transistor 10 consists of a conductive gate region 12 overlying a thin gate oxide 14 that overlies a substrate 16. The gate 12 and the gate oxide 14 are disposed between a drain region 18 and a source region 20 which are formed in the substrate 16 having a channel region 22 located therebetween which underlies the gate 12 and the gate oxide 14.

As the conventional transistor 10 is scaled into the submicron range to reduce its dimensions and thereby improve the transistor packing density on a chip, the transistor 10 begins to experience hot-carrier effects, as illustrated in prior art FIG. 2. These undesirable hot-carrier effects become more evident when the transistor 10 is scaled while maintaining the supply voltage constant or when the supply voltage is not reduced as rapidly as the structural features of the transistor.

The hot-carrier effects are due to an increase in the electrical field within the channel region 22. The increased electric field causes electrons in an inversion layer 26 to be accelerated (or "heated") to an extent that several different undesirable phenomena occur. As illustrated in prior art FIG. 2, the hot-carrier effects can include charge injection, substrate current and electron injection into the gate oxide 14. Perhaps the most crucial hot-carrier effect is the charge injection into the gate oxide 14 that damages the thin oxide and leads to a time-dependent degradation of various transistor characteristics such as the threshold voltage ($V_T$), the linear transconductance ($g_m$) and the saturation current ($I_{DSAT}$).

One prior art solution that reduces the undesired hot-carrier effects of traditional transistor structures is the lightly doped drain (LDD) transistor 30, which is illustrated in prior art FIG. 3. The LDD transistor 30 includes the gate 12 and the gate oxide 14 formed in a conventional manner, wherein lightly doped extension regions 32 are formed adjacent to the drain region 18 and source region 20, respectively. The lightly doped extension regions 32 typically reduce the electric fields near the channel region 22 by about 30–40 percent and thus the hot-carrier reliability of the transistor is greatly improved. The extension regions 32 reduce the electric field by effectively dropping a portion of the drain voltage across the extension region 32.

As transistor designers continue to scale down the transistor device dimensions, the junction depths of the source and drain regions (as well as the lightly doped drain extension region) also need to be reduced (e.g., make the junctions more shallow). Junction depths must be reduced in conjunction with scaling in order to prevent short channel transistor effects such as punch-through and threshold voltage shift. One conventional approach to reducing the junction depth is to reduce the implant energy used to form the junctions and reduce the diffusion of the junctions in the vertical direction. The source/drain extension regions, however, require ultra-shallow junctions. The shallow p-type junctions needed for the source/drain extension regions of the PMOS LDD structure using B or $BF_2$ are especially difficult to fabricate. Boron suffers considerable channeling during the implant and boron diffusion is enhanced in the presence of silicon interstitials during the heat treatment step, resulting in deeper than expected junctions. As is well known, interstitial atoms can greatly enhance (10 to 1000 times) the diffusivity of dopants. Enhanced diffusivity thus causes undesirable spreading of the dopants during thermal annealing that is carried out to repair the crystal structure of the substrate after doping.

Although LDD type transistor structures do aid in the reduction of short channel effects, the extension regions under the gate can in some cases reduce transistor performance with respect to speed by reducing the drive current to off current ratio and increasing the gate to source/drain junction overlap capacitance. Therefore there is a need in the art to generate a PMOS LDD transistor structure that addresses the problems associated with short channel effects without substantially reducing transistor switching speed performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a method of forming a PMOS LDD type transistor structure that exhibits a substantial improvement in transistor speed due to reduced lateral diffusion of the transistor extension regions. The lateral diffusion of the extension region is reduced by providing an angled amorphizing implant into the transistor substrate prior to an LDD implant. The amorphizing implant substantially disrupts the lattice of the substrate, and the angled amorphizing implant causes such disruption to occur in a region under the gate near the edges of the channel region. Consequently, during subsequent LDD implantation and anneal, the lateral diffusion of the p-type LDD dopant is reduced, thereby reducing a gate overlap capacitance of the transistor while still providing sufficient mitigation of short channel effects.

In addition, after the angled amorphizing implant, a fluorine implant may be included, for example, an angled fluorine implant in a manner similar to the amorphizing implant. The fluorine further acts to retard the diffusion, particularly the lateral diffusion, of the subsequently implanted p-type LDD dopant, thereby reducing a lateral extent to which the resulting LDD regions underlie the transistor gate. Therefore the fluorine further works to enhance transistor speed performance without negatively impacting the manner in which the LDD regions mitigate transistor short channel effects as transistor scaling continues.

In accordance with one aspect of the present invention, a method of forming a PMOS LDD transistor is disclosed. The method comprises forming a gate over an n-type portion of a semiconductor substrate (e.g., a deep n-well region within a p-type substrate), thereby defining source and drain regions therein on either side of the gate, and a channel region in the substrate thereunder. The semiconductor substrate is then subjected to an angled amorphizing implant, wherein the amorphizing species causes significant lattice disruption in the source and drain regions of the substrate as well as lattice disruption in portions of the channel region near a lateral edge of the overlying gate.

The method of the present invention further comprises the formation of extension regions using a p-type LDD implant in the source and drain regions adjacent the gate. An anneal is then performed, wherein diffusion associated with the anneal is generally controlled, for example, being reduced in at least the lateral direction under the gate of the transistor, thereby minimizing a gate overlap capacitance associated therewith. The lateral diffusion of the source and drain extension regions is reduced due to the amorphized regions in the channel near the lateral edges of the gate. When annealing occurs, the severe lattice disruption is repaired, causing the substrate atoms that were previously interstitials to reform, with the amorphizing atoms moving to substitutional sites in the crystal. Therefore the number of interstitials in the lattice is reduced, thereby reducing enhanced diffusion typically associated therewith.

In accordance with another aspect of the present invention, the amorphizing implant is performed with a heavy ion such as antimony or germanium. For example, the amorphizing implant is performed at an angle of about 9 degrees, with a Sb dose of about $3 \times 10^{13}$ ions/cm$^2$ with an implantation energy of about 30 keV. Such an implant creates a substantial lattice disruption in the substrate, thereby rendering portions thereof amorphous.

In accordance with yet another aspect of the present invention, a method of forming a PMOS LDD transistor comprises using an angled amorphizing implant followed by an angled fluorine implant prior to an LDD extension region implant. Subsequently, the p-type LDD implant is performed using boron (e.g., B or $BF_2$). During the subsequent anneal, the fluorine further aids in retarding the diffusion of the boron dopant, both vertically and laterally. By having an angled fluorine implant, the fluorine particularly aids in reducing lateral diffusion associated with the source/drain extension regions, thereby reducing a gate overlap capacitance associated therewith. Consequently, the LDD transistor retains the benefits of mitigating short channel effects while exhibiting increased transistor speed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The present invention is directed to a method of forming a PMOS LDD type transistor structure that exhibits improved speed and/or reduced gate overlap capacitance due to reduced lateral diffusion of extension region dopants. The reduction in lateral diffusion is obtained by performing an angled amorphizing implant after formation of the gate structure and before the formation of a wide sidewall spacer.

The angled amorphizing implant creates sufficient lattice disruption in the substrate to render extension regions in the substrate amorphous, including portions of the channel region near and under the lateral edges of the transistor gate. Subsequently, the LDD implant is performed and during anneal, the diffusion thereof is limited by the amorphous regions in the substrate, thereby reducing a vertical and lateral diffusion of the extension regions. The reduced lateral diffusion of the LDD extension regions advantageously reduces the transistor gate overlap capacitance. The reduction in lateral diffusion may be further enhanced in the present invention by employing an angled fluorine implant prior to the p-type LDD implant. The fluorine further aids in retarding the diffusion of the LDD regions when the LDD dopant is boron.

Figure 1:
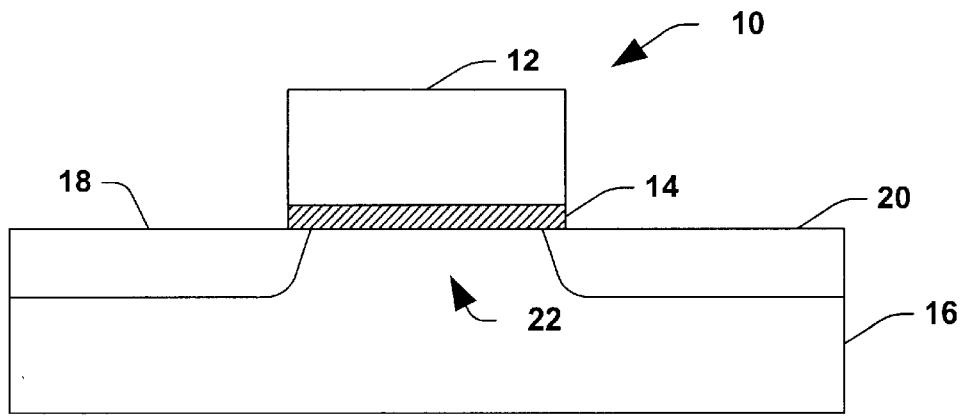
FIG. 1 is a fragmentary cross section diagram illustrating a conventional MOS type transistor structure.
Figure 2:
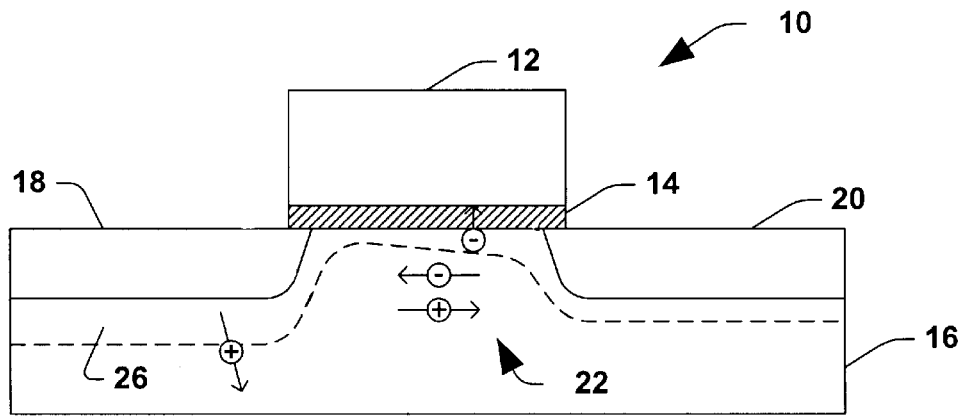
FIG. 2 is a fragmentary cross section diagram illustrating various types of short channel effects associated with the MOS transistor of FIG. 1 when a depletion region has formed therein.
Figure 3:
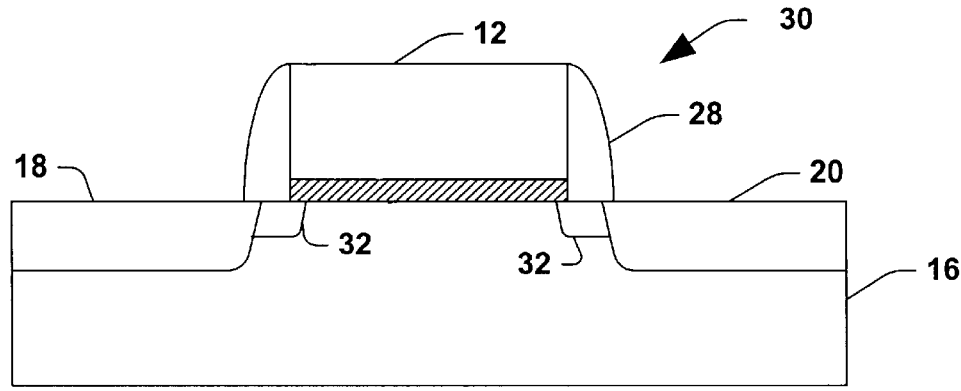
FIG. 3 is a fragmentary cross section diagram illustrating a conventional LDD type MOS transistor structure employed to mitigate short channel effects.
Figure 4:
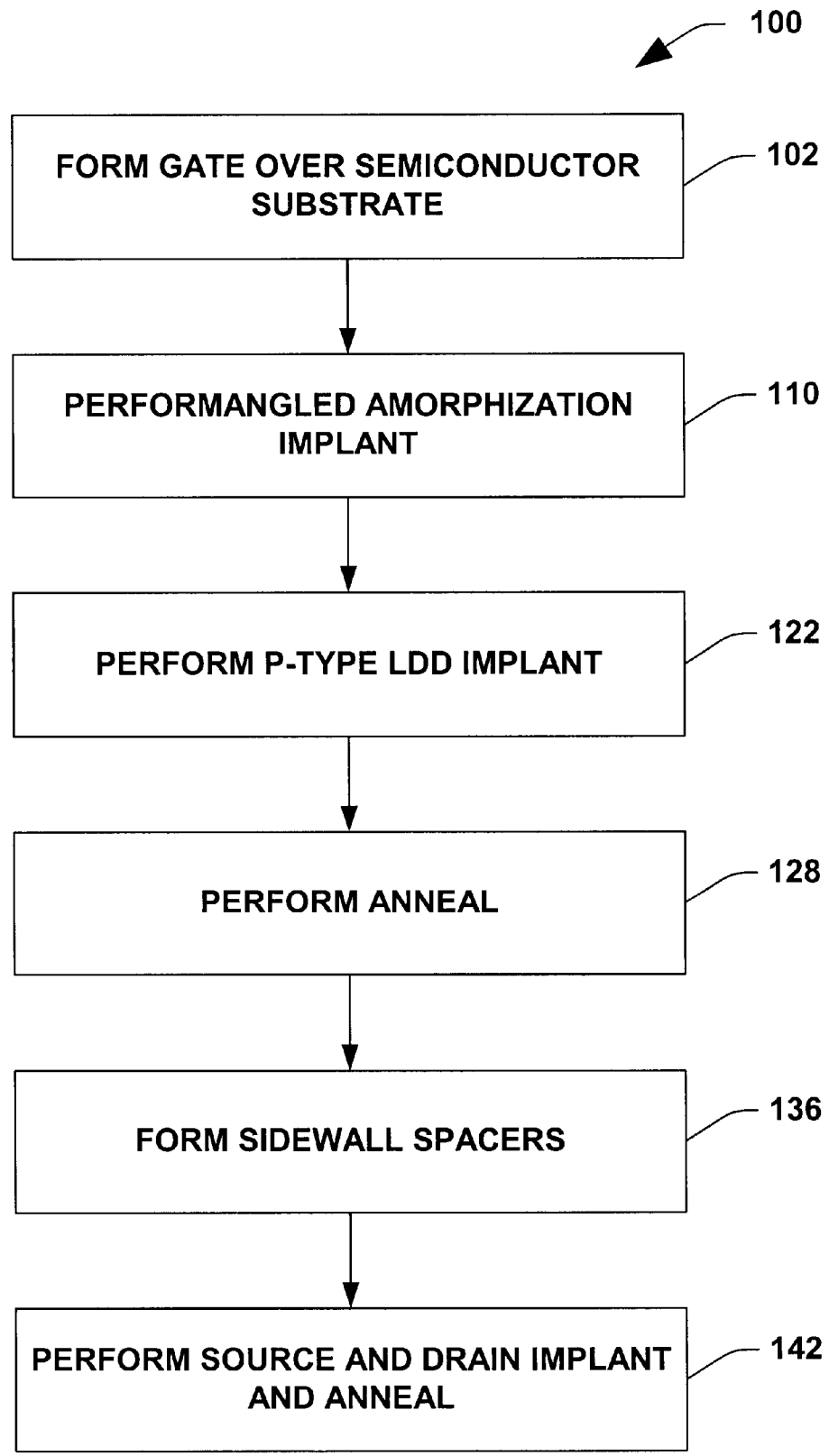
FIG. 4 is a flow chart diagram illustrating a method of forming an LDD type PMOS transistor structure in accordance with one exemplary aspect of the present invention.

Turning now to the figures, FIG. 4 is a flow chart diagram illustrating a method 100 of forming an LDD type PMOS transistor in accordance with one exemplary aspect of the present invention. Although the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with PMOS transistors illustrated and described herein as well as in association with other devices not illustrated.

Figure 5:
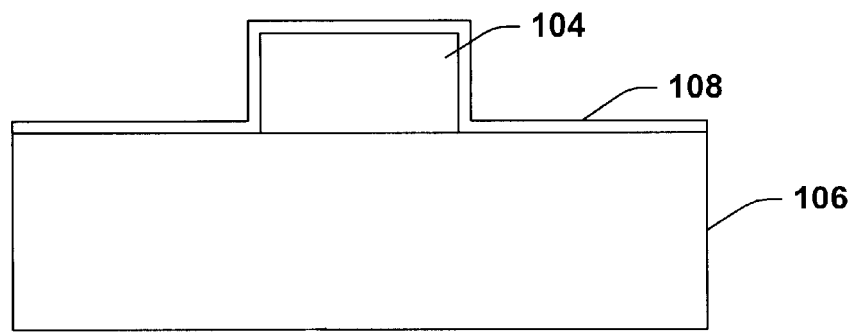
FIG. 5 is a fragmentary cross section diagram illustrating a transistor gate structure overlying a semiconductor structure according to the present invention.

The method 100 begins at 102, wherein a gate structure 104 is formed over a semiconductor substrate 106, as illustrated in FIG. 5. In addition, in one example, an oxide layer 108 (sometimes referred to as a pad oxide) is formed over the gate structure. In one aspect of the invention, the gate structure 104 is a polysilicon structure formed via a chemical vapor deposition (CVD) and a lithographic patterning using conventional techniques.

Figure 6:
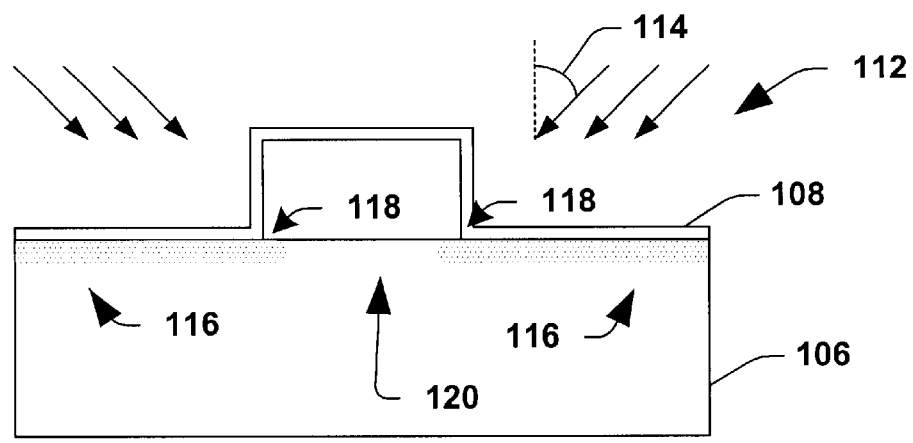
FIG. 6 is a fragmentary cross section diagram illustrating an angled amorphizing implant which is self-aligned with respect to the transistor gate structure according to the present invention.

The method 100 of FIG. 4 continues at 110, wherein an angled amorphizing implant is performed into the semiconductor substrate 106. For example, as illustrated in FIG. 6, the implant 112 is performed at an angle 114 calculated from a normal to the substrate 106, wherein the angle 114 is non-zero. In one aspect of the present invention, the amorphizing implant is performed with a heavy ion species such as antimony (Sb) or germanium (Ge), however, other species may be employed and are contemplated as falling within the scope of the present invention. For example, an antimony implant having a dose of about $3\times10^{13}$ ions/cm$^2$ with an implantation energy of about 30 keV may be employed at an implantation angle 114 of about 9 degrees to generate an amorphized region 116 in the semiconductor substrate 106. As illustrated in FIG. 6, the amorphized region 116, due to the implant angle 114, extends under lateral sidewall portions 118 of transistor gate 104; that is, the region 116 extends slightly into a channel portion 120 of the substrate 106.

Figure 7:
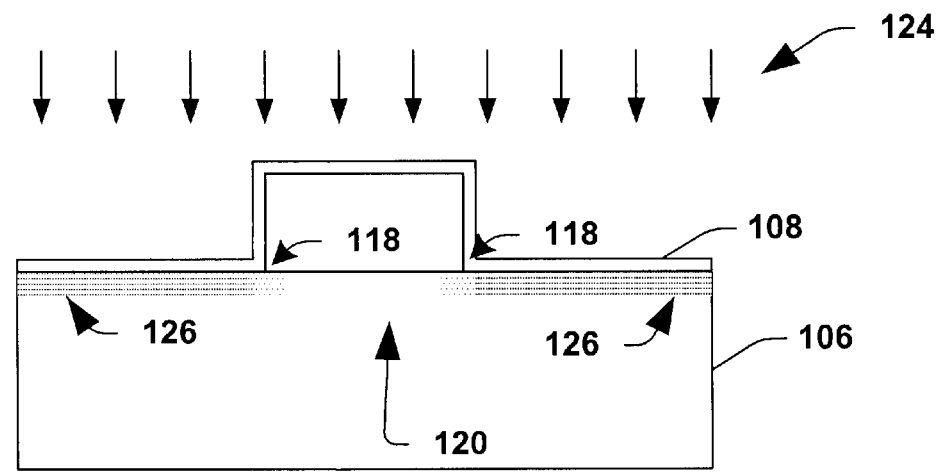
FIG. 7 is a fragmentary cross section diagram illustrating a non-angled p-type LDD implant which is self-aligned with respect to the transistor gate according to the present invention.

Returning to FIG. 4, the method 100 continues at 122, wherein a p-type LDD implant 124 is performed into the semiconductor substrate 106. As illustrated in FIG. 7, such an implant 124 is performed without an angle; that is, the angle between the implantation and a normal to the substrate surface is about 0 degrees. The LDD implant 124 is also self aligned with respect to the transistor gate 104, however, since the angle is about 0 degrees, the dopant does not underlie lateral portions 118 of the transistor gate. Therefore the LDD dopant species form a pre-anneal extension region 126, as illustrated in FIG. 7.

Figure 8:
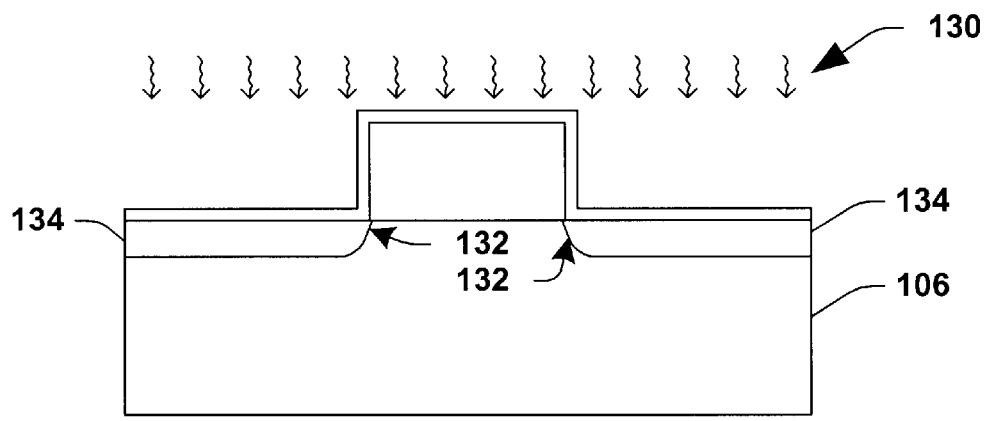
FIG. 8 is a fragmentary cross section diagram illustrating an anneal of the semiconductor substrate subsequent the amorphizing and LDD implants according to the present invention.

The method 100 continues with an anneal of the semiconductor substrate at 128 of FIG. 4. According to one exemplary aspect of the present invention, the LDD anneal is performed at a temperature of about 900° C. or more and about 1075° C. or less for a time of about 30 seconds or less (and in some cases only a brief pulse), as illustrated in FIG. 8 at 130. The anneal 130 causes the amorphized regions 116 and doped extension regions 126 in the substrate 106 to repair. Because the amorphized regions of the substrate are substantially damaged, the repair causes the LDD dopant to occupy the re-grown or repaired lattice sites while the amorphizing species (e.g., Sb or Ge) occupy substitutional sites in the lattice. Therefore the amount of interstitials is greatly reduced due to the amorphization, and the reduction in interstitials causes a reduction in enhanced diffusion during anneal that would otherwise be associated therewith.

In particular, the use of the angled amorphization implant 112 causes the amorphous regions to also form under a portion 118 of the gate. Therefore not only does the amorphization implant 112 reduce LDD dopant species diffusion vertically, but the diffusion is also substantially reduced in the lateral direction, thereby reducing an amount 132 in which the resulting LDD or extension regions 134 extend under the transistor gate 104, as illustrated in FIG. 8.

Figure 9:
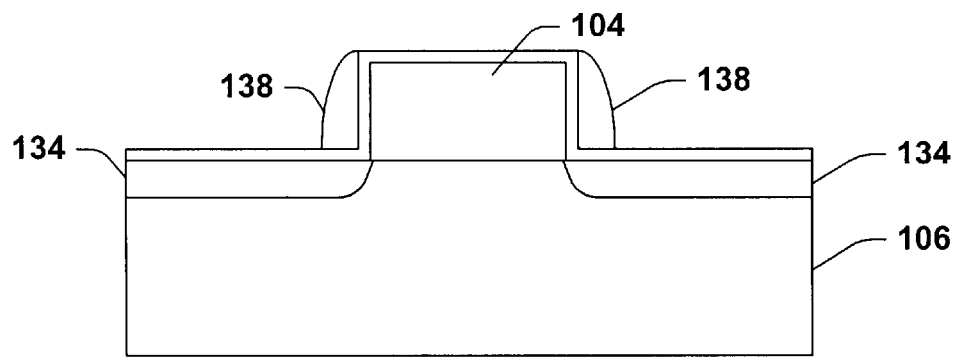
FIG. 9 is a fragmentary cross section diagram illustrating a formation of sidewall spacers on lateral sidewall portions of the transistor gate according to the present invention.
Figure 10:
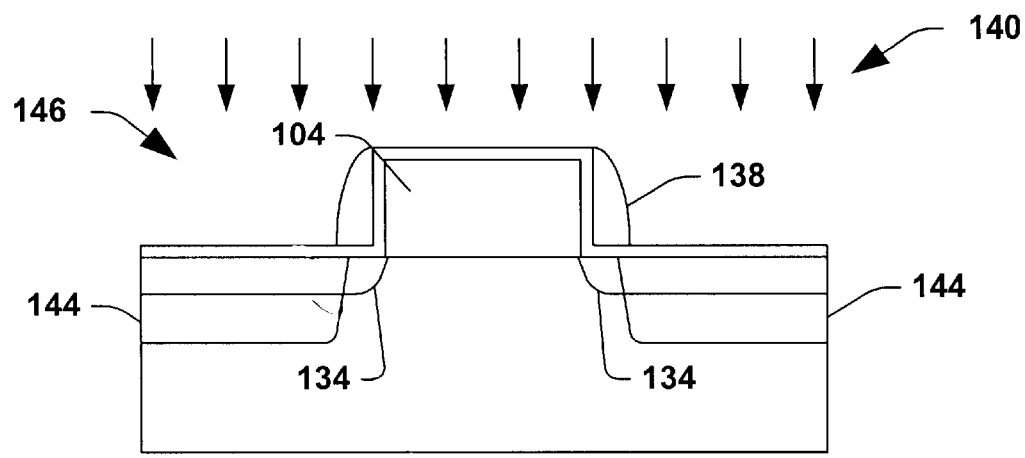
FIG. 10 is a fragmentary cross section diagram illustrating a non-angled source/drain type implant and anneal according to the present invention.

The method 100 of FIG. 4 continues at 136, wherein sidewall spacers 138 are formed on the lateral sidewall edges of the transistor gate 104, as illustrated in FIG. 9. In one example, the sidewall spacers 138 comprise a nitride layer formed via CVD which is subsequently etched using a generally anisotropic etch to remove nitride in areas overlying the gate 104 and portions overlying the extension regions 134. A source/drain implant 140 and subsequent anneal is then performed at 142 of FIG. 4 to form source drain regions 144 that are self-aligned with respect to the transistor gate 104 and sidewall spacers 138, respectively, as illustrated in FIG. 10, resulting in a transistor structure 146.

Figure 11:
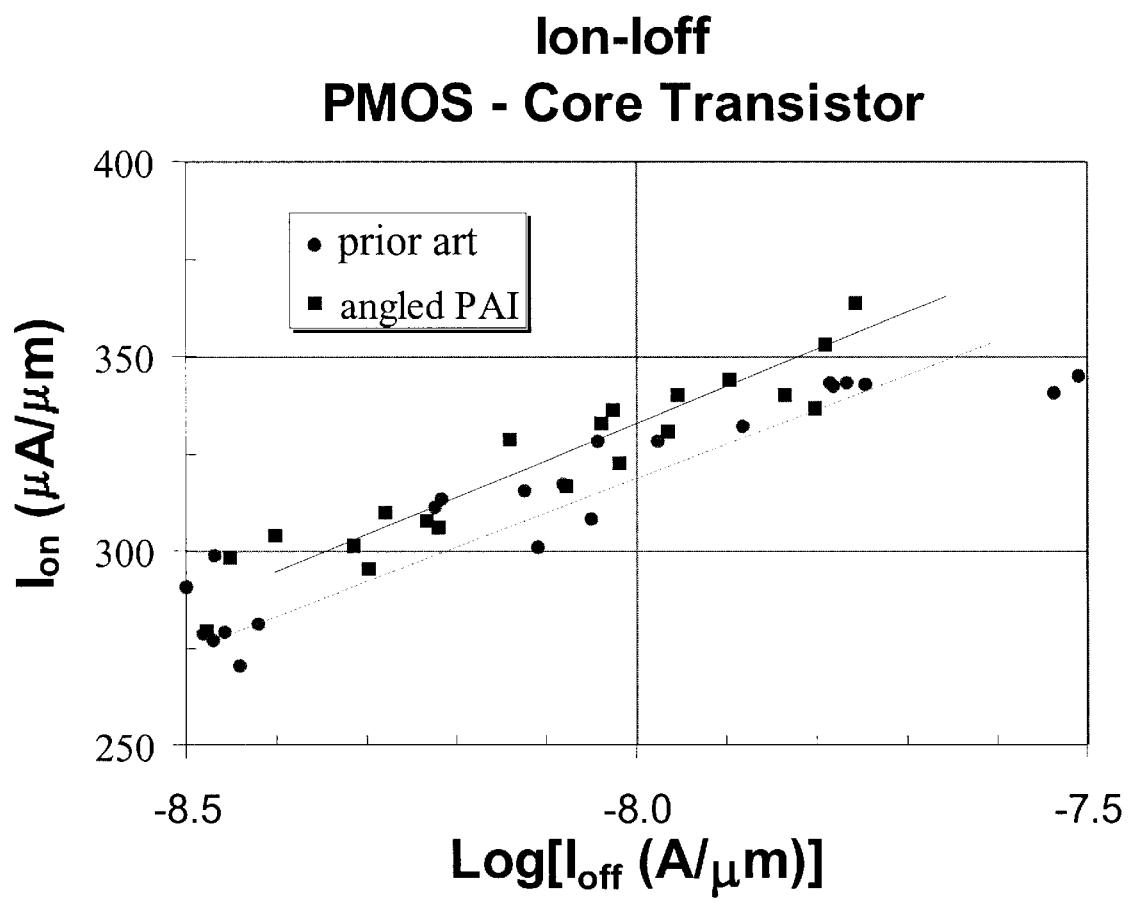
FIG. 11 is a chart illustrating an Ion-Ioff ratio for a prior art LDD transistor structure and a PMOS LDD structure fabricated in accordance with the present invention.
Figure 12:
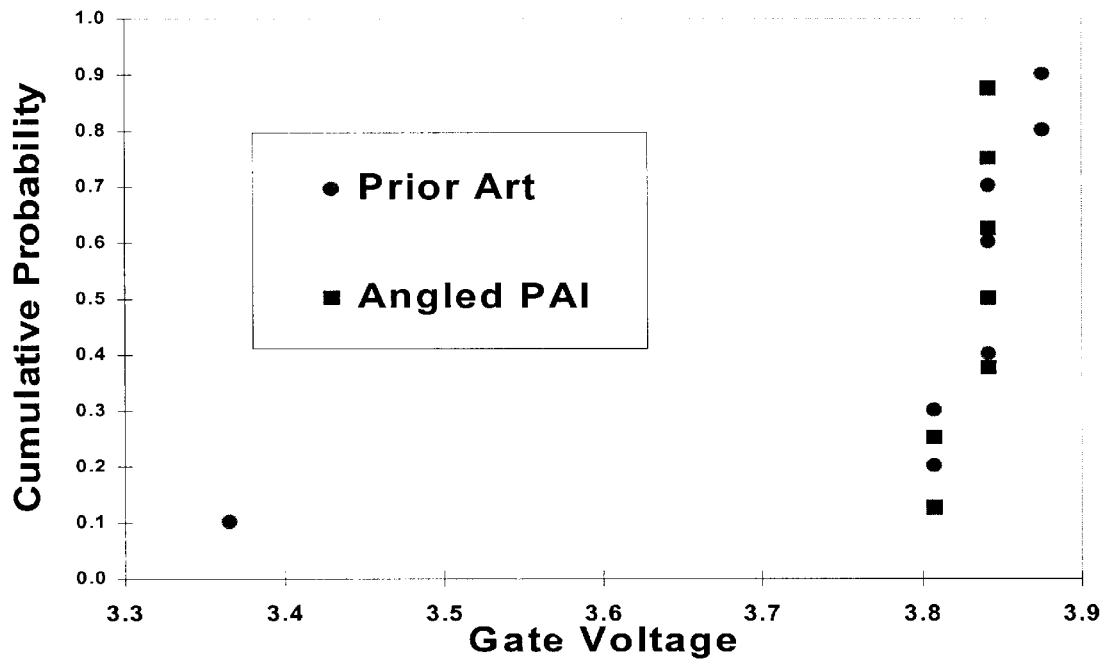
FIG. 12 is a chart illustrating a gate oxide integrity for a number of prior art structure and a number of structures manufactured in accordance with the present invention.
Figure 13:
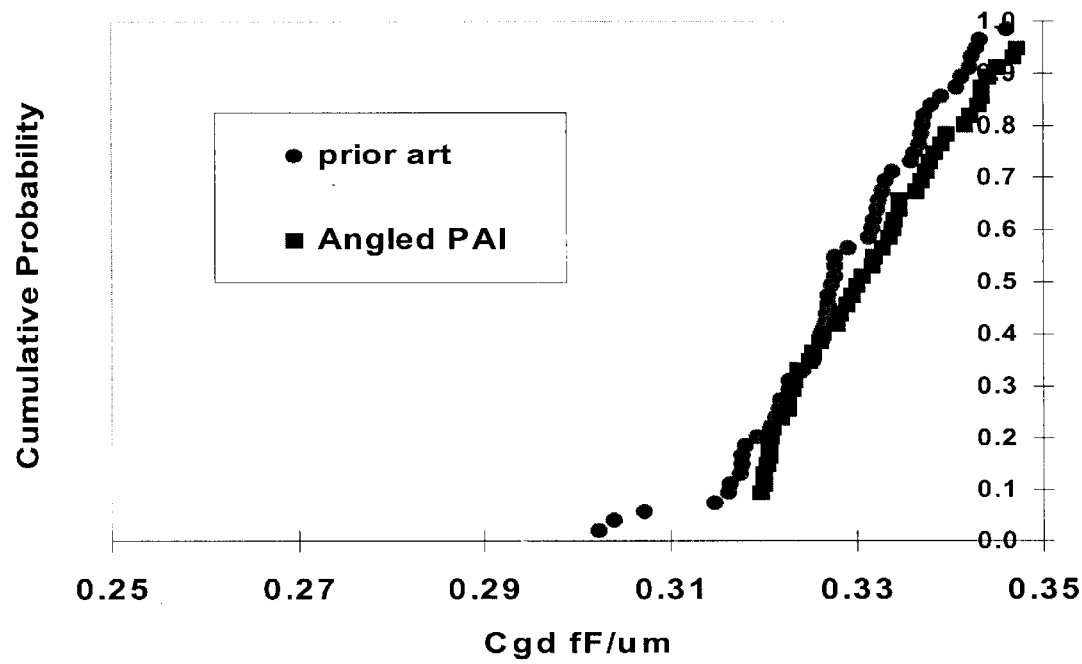
FIG. 13 is a chart illustrating a gate overlap capacitance for a number of prior art structures and a number of PMOS LDD structures fabricated in accordance with the present invention.

Due to the angled amorphizing implant discussed in conjunction with FIGS. 4 and 6, the resulting transistor structure 146 exhibits improved performance over conventional PMOS LDD transistors. For example, as illustrated in FIG. 11, the transistor structure 146 of the present invention was characterized and found to exhibit improved speed with regard to the |on-|off ratio. As illustrated in FIG. 11, the transistor structure 146 exhibits about a 3% improvement in speed and such a benefit is not at the expense of other transistor performance characteristics such as gate oxide integrity or gate overlap capacitance. For example, as illustrated in FIGS. 12 and 13, respectively, the transistor structure 146 of the present invention exhibits no significant deterioration in gate oxide integrity (see FIG. 12) or increase in the gate overlap capacitance (see FIG. 13).

Although the above example was discussed in conjunction with the formation of a PMOS transistor, the present invention is also applicable to the formation of an NMOS type transistor, and such a device is contemplated as falling within the scope of the present invention.

Figure 14:
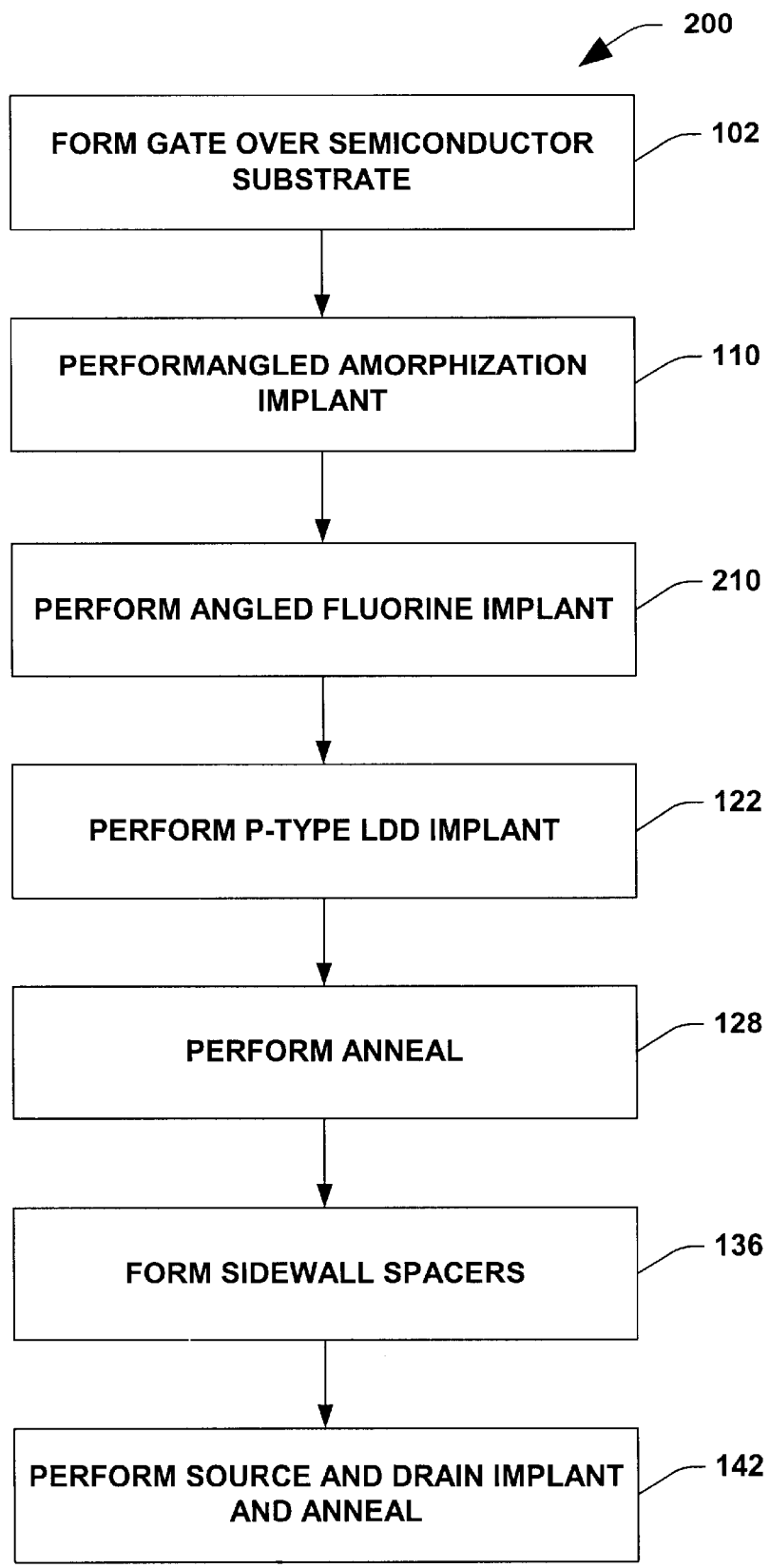
FIG. 14 is a flow chart diagram illustrating a method of forming an LDD type PMOS transistor structure in accordance with another exemplary aspect of the present invention.
Figure 15:
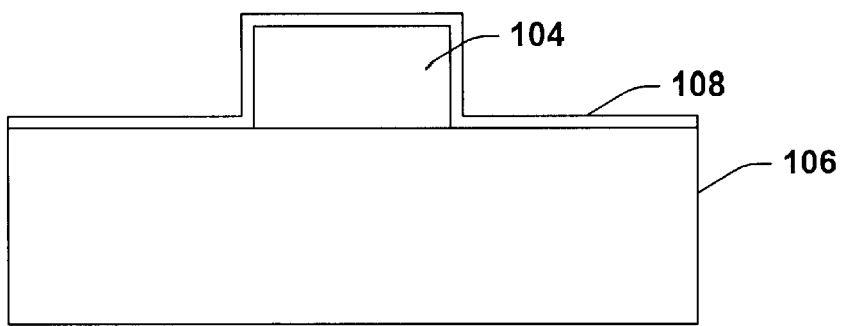
FIG. 15 is a fragmentary cross section diagram illustrating a transistor gate structure overlying a semiconductor structure according to the present invention.
Figure 16:
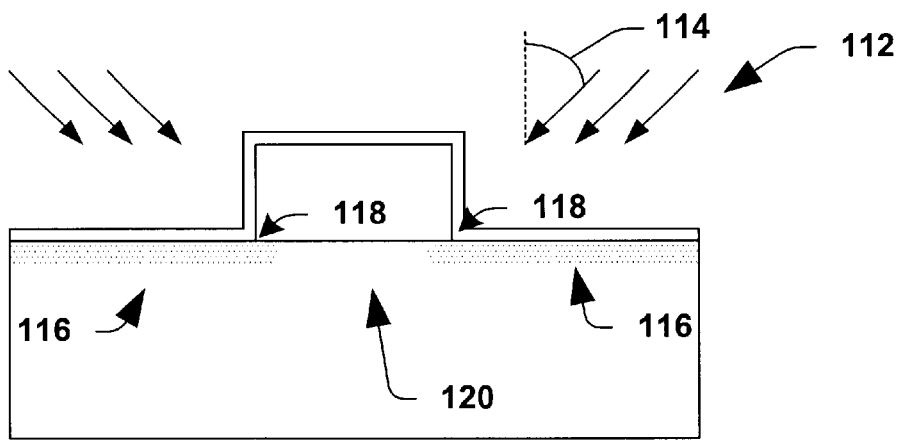
FIG. 16 is a fragmentary cross section diagram illustrating an angled amorphizing implant which is self-aligned with respect to the transistor gate structure according to the present invention.
Figure 17:
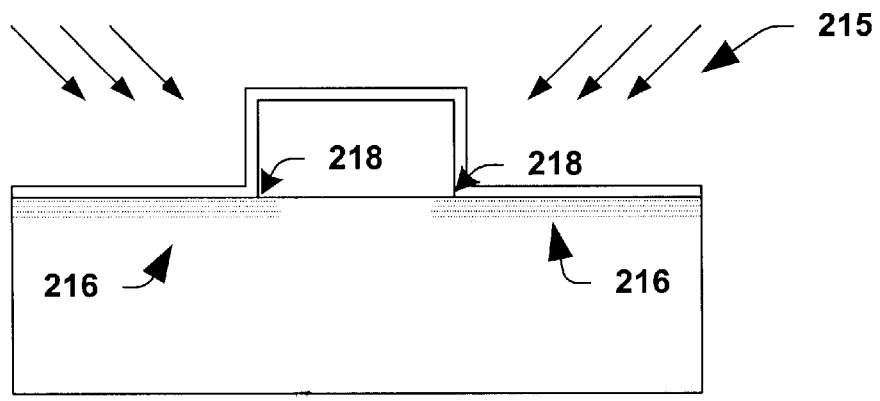
FIG. 17 is a fragmentary cross section diagram illustrating an angled fluorine implant which is self-aligned with respect to the transistor gate structure according to the present invention.

In accordance with another aspect of the present invention, a method 200 of forming a PMOS LDD transistor is illustrated in FIG. 14. Similar to the method 100 of FIG. 4, the transistor is fabricated by forming the gate 104 and performing an angled amorphization implant at 110, respectively, as illustrated in FIGS. 15 and 16, respectively. Then at 210, prior to an LDD implant, an angled fluorine implant 215 is performed, as illustrated in FIG. 17, to form fluorine doped amorphous regions 216. As will be described in greater detail, the angled fluorine dopant helps to further reduce an amount of diffusion of the subsequent LDD implant.

The fluorine implant, in one example, is implanted with a dose in the range from about $1\times10^{13}$ to about $1\times10^{18}$ atoms/cm$^2$. In another example, the fluorine dopant is implanted with a dose in the range from about $1\times10^{14}$ to about $1\times10^{17}$ atoms/cm$^2$. In a further example, the fluorine dopant is implanted with a dose in the range from about $5\times10^{14}$ to about $1\times10^{16}$ atoms/cm$^2$. As a specific example, fluorine can be implanted with a dose from about $1\times10^{15}$ to about $2\times10^{15}$ atoms/cm$^2$.

The depth of penetration of the fluorine dopant can be controlled through the energy level imparted to the ions used to form the implant. The energy is selected so that the fluorine dopant is substantially limited to the amorphized layer. For example, a fluorine implant can be carried out at an energy of about 2 to about 3 keV. Diffusion tends to cause the fluorine dopant to become evenly dispersed within the amorphized layer 116. Due to the angled implant 215, the fluorine dopant also resides under a lateral edge 218 of the channel 120 in a manner similar to the amorphizing dopant. Therefore the fluorine advantageously also resides in the region 218, wherein the lateral diffusion of a subsequent LDD type implant dopant species is retarded.

Figure 18:
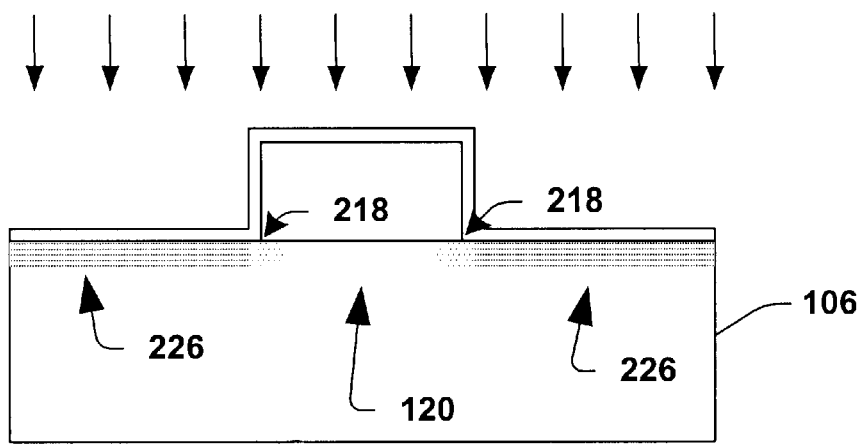
FIG. 18 is a fragmentary cross section diagram illustrating a non-angled p-type LDD implant which is self-aligned with respect to the transistor gate structure according to the present invention.
Figure 19:
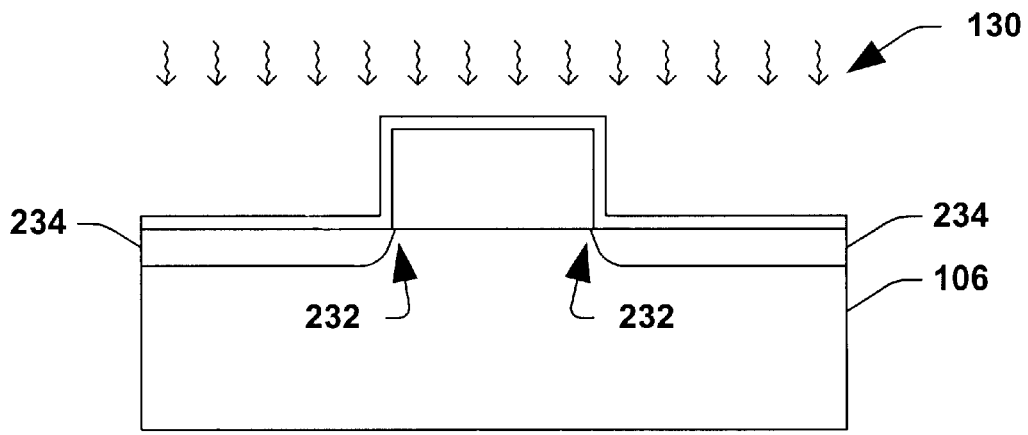
FIG. 19 is a fragmentary cross section diagram illustrating an anneal of the semiconductor substrate subsequent the amorphizing, fluorine and LDD implants according to the present invention.
Figure 20:
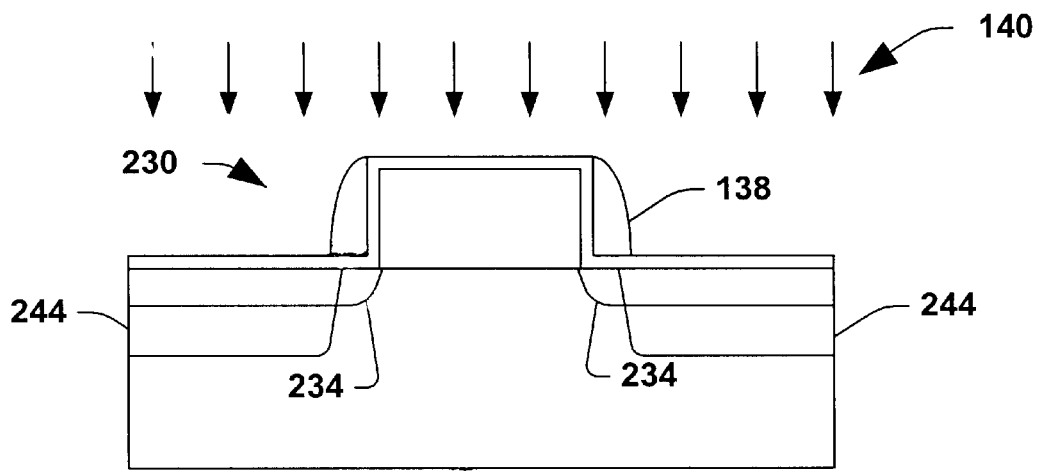
FIG. 20 is a fragmentary cross section diagram illustrating a formation of side a spacers on lateral sidewall portions of the transistor gate, a non-angled source/drain type implant, and an anneal according to the present invention.

The steps of performing the LDD implant 122, LDD anneal 128, forming the sidewall spacers 136 and forming the source/drain regions 142 to form a transistor structure 230 then may proceed, for example, in a manner similar to that previously described in conjunction with FIG. 4, and such steps are illustrated in FIGS. 18–20, respectively. It should be noted that in the anneal 128 of FIG. 14, the heating causes a portion of the fluorine atoms to diffuse through the substrate, and become substituted in the crystal matrix thereof. The heating also causes a portion of the fluorine dopant atoms to react with interstitials within the substrate and form interstitial species, which diffuse out of the substrate, thereby further reducing interstitials therein.

Figure 21:
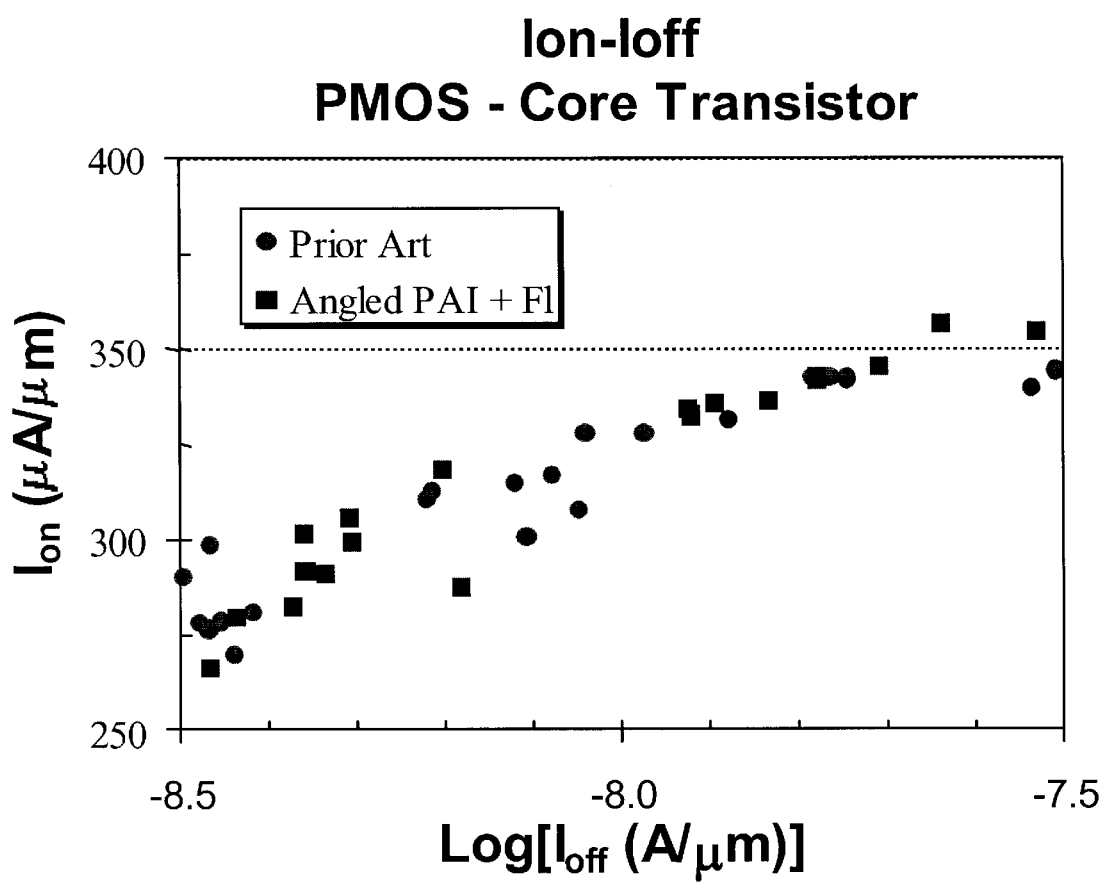
FIG. 21 is a chart illustrating an lon-loff ratio for a prior art LDD transistor structure and a PMOS LDD structure fabricated in accordance with the present invention.
Figure 22:
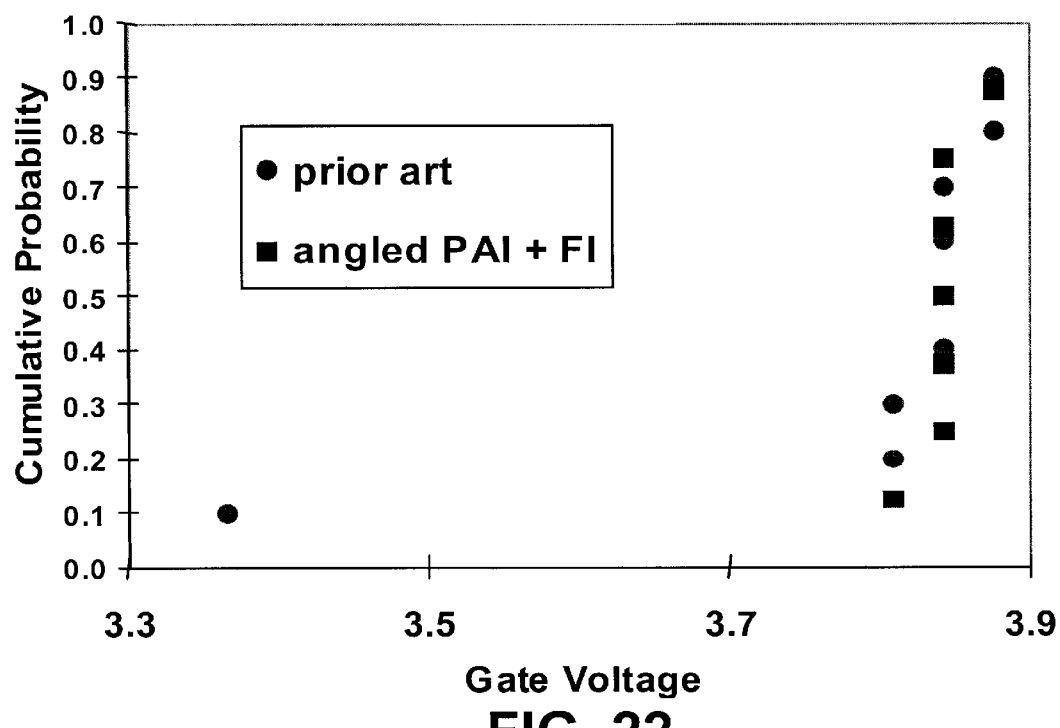
FIG. 22 is a chart illustrating a gate oxide integrity for a number of prior art structures and a number of structures manufactured in accordance with the present invention.
Figure 23:
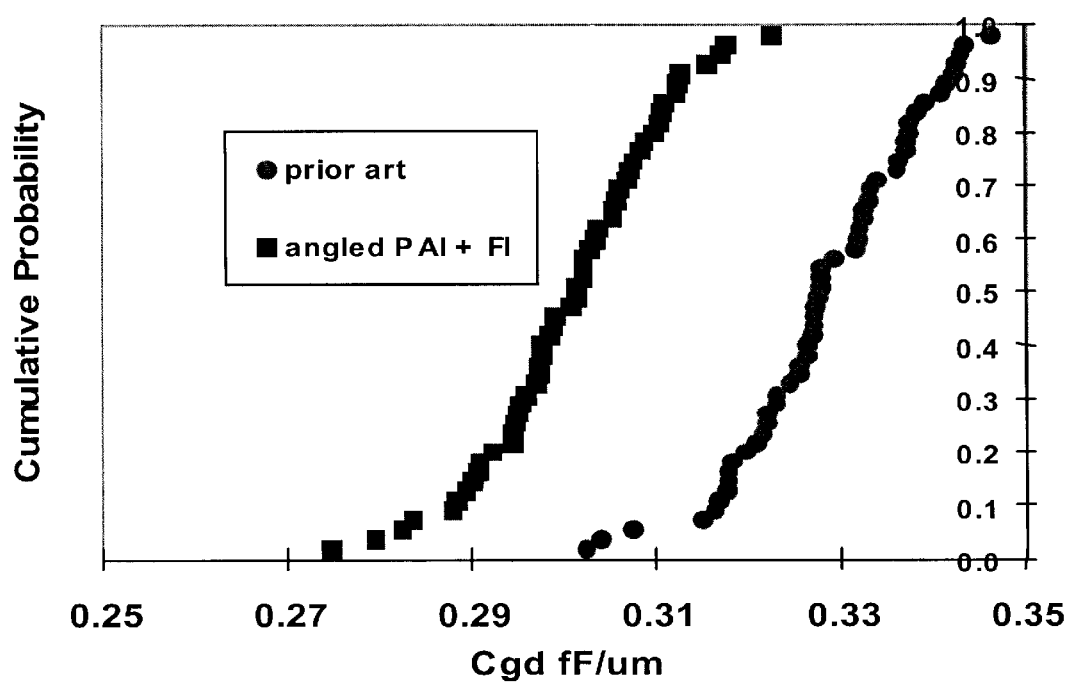
FIG. 23 is a chart illustrating a gate overlap capacitance for a number of prior art structures and a number of PMOS LDD structures fabricated in accordance with the present invention.

The fluorine dopant atoms therefore function to remove interstitials from the crystal matrix and thereby substantially reduce the depth and lateral extent to which the target p-type boron dopant atoms penetrate during the anneal. In particular, due to the angled fluorine implant, the fluorine dopant under the gate in regions 218 further reduces the lateral diffusion of the extension regions under the gate, thereby substantially improving transistor performance. For example, as illustrated in FIG. 21, the transistor structure 230 of the present invention was characterized and found to exhibit no degradation of the |on-|off ratio. In addition, the structure 230 was found to exhibit a figure of merit improvement relating to speed of about 2% without an detriment to other transistor performance characteristics such as gate oxide integrity (see FIG. 22). Lastly, as illustrated in FIG. 23, the transistor structure 230 provided for a significant decrease in gate overlap capacitance (a reduction of about 5%).

Although the above example was discussed in conjunction with the formation of a PMOS transistor, the present invention employing fluorine to reduce the lateral diffusion is also applicable to the formation of an NMOS type transistor, and such a device is contemplated as falling within the scope of the present invention.

In addition, although the above example employing fluorine was shown and described in conjunction with the formation of LDD type transistors having a pre-amorphization implant, the present invention employing an angled fluorine implant to reduce lateral diffusion of source/drain regions can be employed independently of amorphizing implants and may be employed in the formation of both LDD transistors or transistors not employing extension regions, and all such devices are contemplated as falling within the scope of the present invention.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming a PMOS transistor within a semiconductor substrate, comprising:

forming a gate over a portion of the semiconductor substrate, thereby defining a source region and a drain region in the semiconductor substrate with a channel region therebetween;

pre-amorphizing the source region and the drain region of the semiconductor substrate with an angled amorphization implant, wherein the angled amorphization implant amorphizes the semiconductor substrate thereat and in portions of the channel region near a lateral edge of the gate, thereby defining an amorphized source extension region and drain extension region, respectively;

implanting the source and drain extension regions with fluorine;

implanting the source region and the drain region with a p-type source/drain extension implant; and annealing to regrow the amorphized regions to a substantially crystalline form.

2. The method of claim 1, wherein pre-amorphizing the source and drain region comprises implanting the semiconductor substrate with an amorphizing implant dopant at an angle greater than 0 degrees.

3. The method of claim 2, wherein the amorphizing dopant comprises antimony and the implanting is performing at a dose of about $3\times10^{13}$ ions/cm$^2$ at an implantation energy of about 30 keV.

4. The method of claim 3, wherein the implant angle comprises an angle of about 9 degrees.

5. The method of claim 3, wherein the amorphizing implant comprises a dopant species selected from the group consisting of Ge, In, Si, and Ar.

6. The method of claim 1, wherein the p-type source/drain extension implant comprises boron.

7. The method of claim 6, wherein the boron source/drain extension implant comprises BF$_2$.

8. The method of claim 7, wherein BF$_2$ implant comprises implanting the BF$_2$ at an angle of about 0 degrees, a dose of about $8\times10^{14}$ ions/cm$^2$, and an implantation energy of about 5 keV.

9. The method of claim 9, wherein the fluorine implant comprises implanting the fluorine at an angle greater than 0 degrees.

10. The method of claim 9, wherein the fluorine implant further comprises implanting the fluorine at an implant angle of about 9 degrees, a dose of about $1$–$2\times10^{15}$ ions/cm$^2$, and an implantation energy of about 2 keV.

11. A method of forming a PMOS transistor within a semiconductor substrate, comprising:

forming a gate over an n-type portion of the semiconductor substrate, thereby defining a source region and a drain region in the semiconductor substrate with a channel region therebetween;

pre-amorphizing the source region, the drain region and portions of the channel region under a lateral edge of the gate, thereby defining an amorphized source extension region and drain extension region having portions that underlie a portion of the gate, respectively;

implanting the source and drain extension regions with fluorine;

implanting the source region and the drain region with a p-type source/drain extension implant;

annealing to repair damage in the semiconductor substrate, wherein the amorphized source and drain extension regions reduce a lateral diffusion thereof during the anneal; and performing source and drain implants in the source and drain regions.

12. The method of claim 11, wherein pre-amorphizing comprises performing an amorphizing implant having an implant angle greater than 0 degrees.

13. The method of claim 12, wherein the amorphizing implant comprises implanting with antimony at a dose of about $3\times10^{13}$ ions/cm$^2$ at an implantation energy of about 30 keV.

14. The method of claim 11, wherein the fluorine implant comprises implanting the fluorine at an angle greater than 0 degrees.

15. The method of claim 14, wherein the fluorine implant further comprises implanting the fluorine at an implant angle of about 9 degrees, a dose of about $1$–$2\times10^{15}$ ions/cm$^2$, and an implantation energy of about 2 keV.

16. A method of forming a PMOS transistor within a semiconductor substrate, comprising:

forming a gate over a portion of the semiconductor substrate, thereby defining a source region and a drain region in the semiconductor substrate with a channel region therebetween;

pre-amorphizing the source region and the drain region of the semiconductor substrate with an angled amorphization implant, wherein the angled amorphization implant amorphizes the semiconductor substrate thereat and in portions of the channel region near a lateral edge of the gate, thereby defining an amorphized source extension region and drain extension region, respectively;

implanting the source and drain extension regions with fluorine;

implanting the source region and the drain region with a boron source/drain extension implant; and annealing to regrow the amorphized regions to a substantially crystalline form.

17. The method of claim 16, wherein pre-amorphizing the source and drain region comprises implanting the semiconductor substrate with an amorphizing implant dopant at an angle greater than 0 degrees.

18. The method of claim 17, wherein the amorphizing dopant comprises antimony and the implanting is performing at a dose of about $3\times10^{13}$ ions/cm$^2$ at an implantation energy of about 30 keV.

19. The method of claim 18, wherein the implant angle comprises an angle of about 9 degrees.

20. The method of claim 16, wherein the amorphizing implant comprises a dopant species selected from the group consisting of Ge, In, Sb, Si, and Ar.

21. The method of claim 16, wherein the p-type source/drain implant comprises boron.

22. The method of claim 21, wherein the boron source/drain implant comprises BF$_2$.

23. The method of claim 22, wherein after BF$_2$ implant comprises implanting the BF$_2$ at an angle of about 0 degrees, a dose of about $8\times10^{14}$ ions/cm$^2$, and an implantation energy of about 5 keV.

24. The method of claim 16, wherein the fluorine implant comprises implanting the fluorine at an angle greater than 0 degrees.

25. The method of claim 24, wherein the fluorine implant further comprises implanting the fluorine at an implant angle of about 9 degrees, a dose of about $1$–$2\times10^{15}$ ions/cm$^2$, and an implantation energy of about 2 keV.

26. A method of forming a transistor associated with a semiconductor substrate, comprising:

forming a gate over a portion of the semiconductor substrate, thereby defining a source region and a drain region in the semiconductor substrate with a channel region therebetween;

implanting fluorine into the source region and the drain region of the semiconductor substrate with an angled implant, wherein the angled fluorine implant provides fluorine in the semiconductor substrate thereat and in portions of the channel region near a lateral edge of the gate;

implanting the source region and the drain region with a source/drain implant; and annealing to repair damage in the semiconductor substrate due to the source/drain implantation, wherein the fluorine in the channel region near the lateral edge of the gate reduce a lateral diffusion thereof during the anneal.

27. The method of claim 26, wherein the substrate is a p-type substrate, further comprising forming an n-well in the p-type substrate, and wherein the source/drain implant is a p-type dopant.

28. The method of claim 26, further comprising:
   performing a source/drain extension region implant after formation of the gate and after the fluorine implant; and
   forming sidewall spacers on the lateral edges of the gate prior to the source/drain implant.

29. The method of claim 26, wherein the substrate is a p-type substrate, further comprising forming an n-well in the p-type substrate, and wherein the source/drain extension region implant is a p-type dopant providing a first dopant concentration, and wherein the source/drain implant is a p-type dopant providing a second dopant concentration, wherein the second dopant concentration is greater than the first dopant concentration.

* * * * *